United States Patent [19]

Welch et al.

[11] Patent Number: 4,845,725

[45] Date of Patent: Jul. 4, 1989

[54] WINDOW LASER WITH HIGH POWER REDUCED DIVERGENCE OUTPUT

[75] Inventors: David F. Welch; Donald R. Scifres, both of San Jose, Calif.

[73] Assignee: Spectra Diode Laboratories, Inc., San Jose, Calif.

[21] Appl. No.: 53,093

[22] Filed: May 20, 1987

[51] Int. Cl.$^4$ ............................................... H01S 3/19
[52] U.S. Cl. ........................................ 372/46; 372/45; 372/49
[58] Field of Search ................................... 372/43-46, 372/49

[56] References Cited

U.S. PATENT DOCUMENTS

| 4,337,443 | 6/1982 | Umeda et al. | 372/49 |
| 4,546,480 | 10/1985 | Burnham et al. | 372/45 |
| 4,594,603 | 6/1986 | Holonyak et al. | 372/46 |

OTHER PUBLICATIONS

Burnham et al., "Prevention of Optical Facet Damage In Semiconductor Laser", Xerox Disclosure Journal, vol. 4, No. 5, Sep./Oct. 79, p. 637.
Yonezu et al., "An AlGaAs Window Structure Laser", IEEE Journal of Quantum Electronics, vol. QE-15, No. 8, Aug. 1979, pp. 775-781.
Thornton et al, "High Power (2.1 W) 10-Stripe AlGaAs Laser Arrays with Si Disordered Facet Windows", Appl. Phys. Lett., 49(23), Dec. 8, 1986, pp. 1572-1574.
T. Murakami et al., "High-Power AlGaAs Laser with a Thin Tapered-Thickness Active Layer," Electronic Letters, vol. 22, No. 4, Feb. 13, 1986, pp. 217-218.
H. Blauvelt et al., "Large Optical Cavity AlGaAs Buried Heterostructure Window Lasers," Applied Physics Letters, vol. 40, No. 12, Jun. 15, 1982, pp. 1029-1031.
H. Nakashima et al., "AlGaAs Window Stripe Buried Multiquantum Well Lasers," Jap. Journal of Applied Physics, vol. 24, No. 8, Aug. 1985, pp. L647-L649.
M. Ueno, "Optimum Design Conditions for AlGaAs Window Stripe Lasers," IEEE Journal of Quantum Electronics, vol. QE-17, No. 10, Oct. 1981, pp. 2113-2122.
H. Yonezu et al., "High Optical Power Density Emission from a 'Window-Stripe' AlGaAs Double-Heterostructure Laser," Applied Physics Letters, vol. 34, No. 10, pp. 637-639.
Y. Suzuki et al., "Fabrication of GaAlAs 'Window Stripe' Multi-Quantum Well Heterostructure Lasers Utilizing Zn Diffusion-Induced Alloying", Electronics Letters, vol. 20, No. 9, Apr. 26, 1984, pp. 383-384.

Primary Examiner—William L. Sikes
Assistant Examiner—Georgia Y. Epp
Attorney, Agent, or Firm—Thomas Schneck

[57] ABSTRACT

A window laser having at least one window region with a transparent waveguide layer optically coupled to an active region generating lightwaves. The waveguide layer is characterized by a broader guided transverse mode for the lightwaves than the active region and may have a thickness which is greater than the active region, a refractive index difference with respect to cladding layers which is less than a refractive index difference between the active region and the cladding layers, or both. The waveguide layer may be coupled to the active region via a transition region characterized by a gradual change in the guide mode width of the lightwaves, such as from a tapered increase in thickness of the waveguide layer in a direction away from the active region. The preferred method of making window regions having these transparent waveguides is impurity induced disordering, in which the interfaces between active region and cladding layers is smeared to produce the waveguide layer with increased bandgap and a graded transverse refractive index profile. The laser is characterized by a high power output beam with reduced far field transverse divergence.

24 Claims, 2 Drawing Sheets

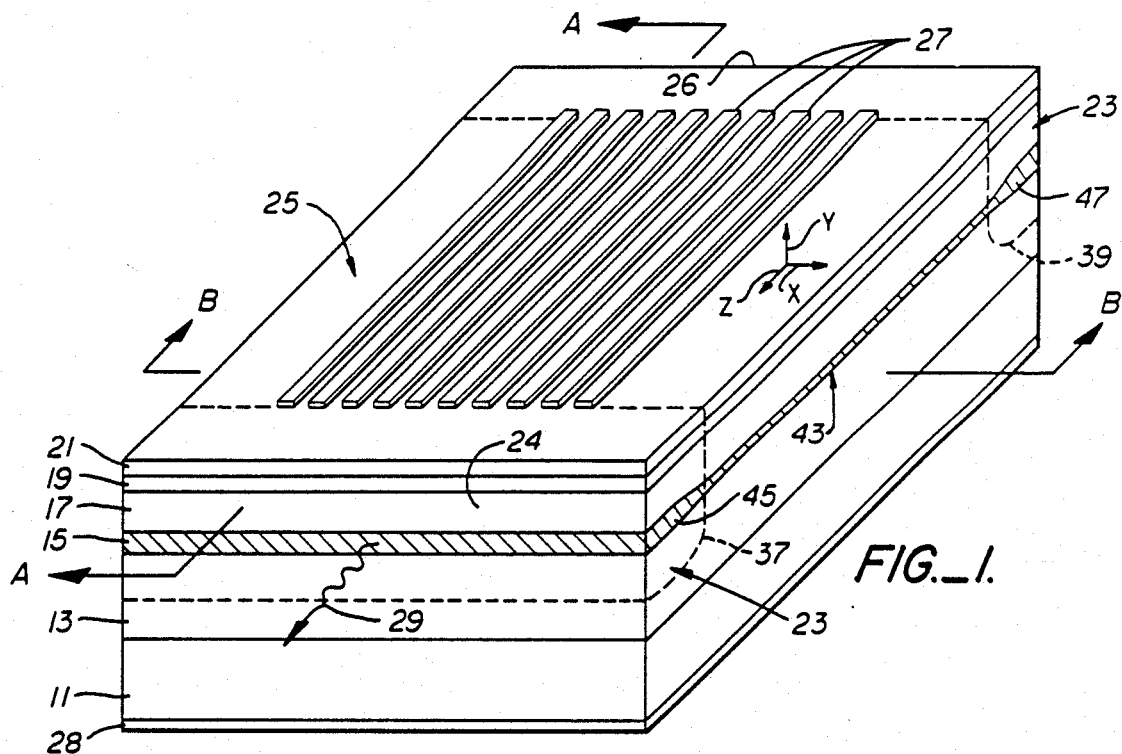
FIG._1.
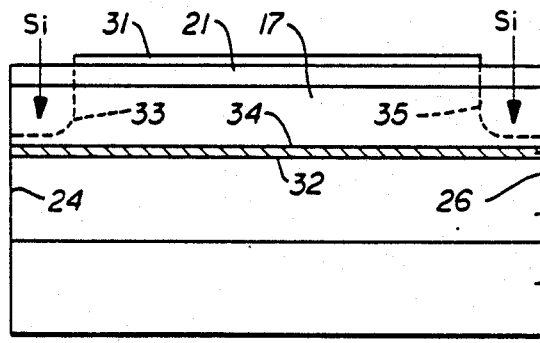
FIG._2.
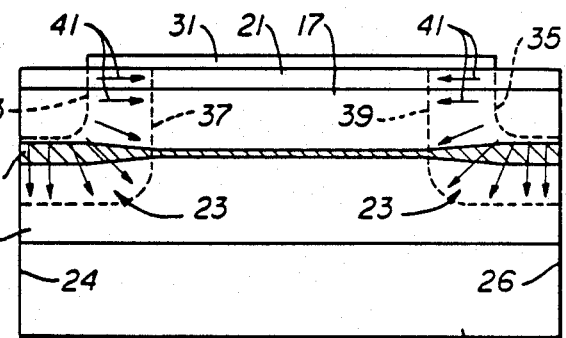
FIG._3.
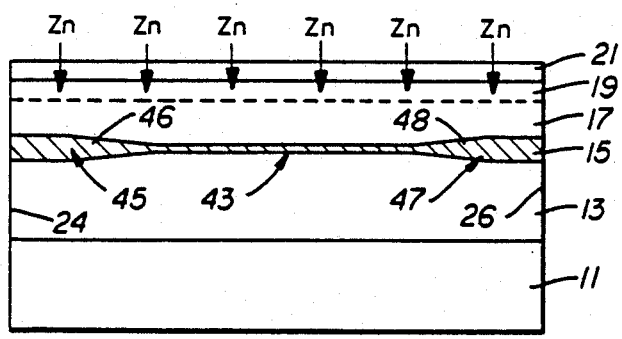
FIG._4.
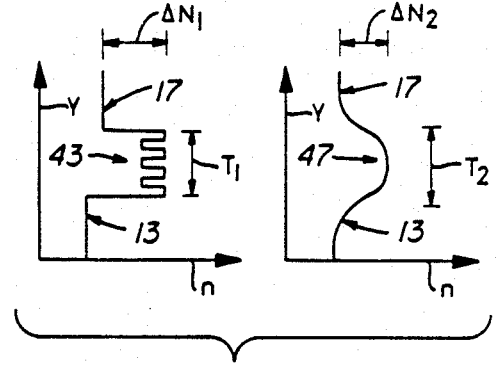
FIG._4A.

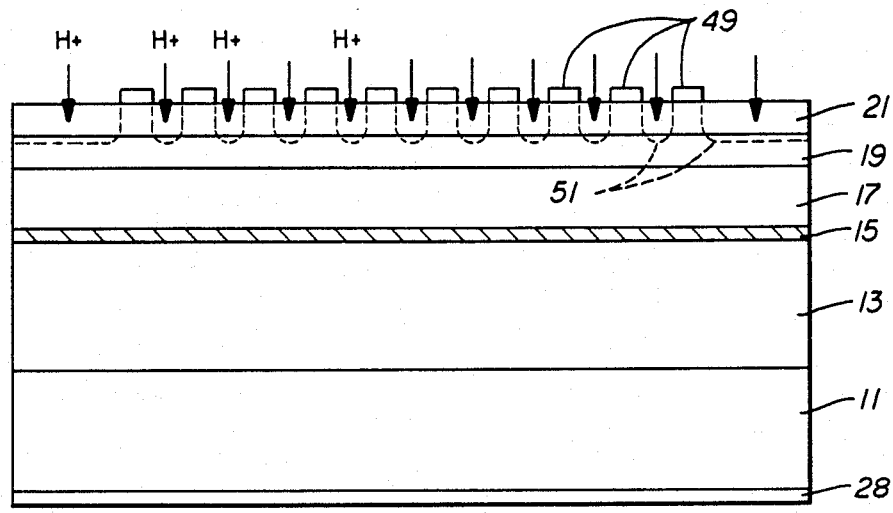
FIG._5.
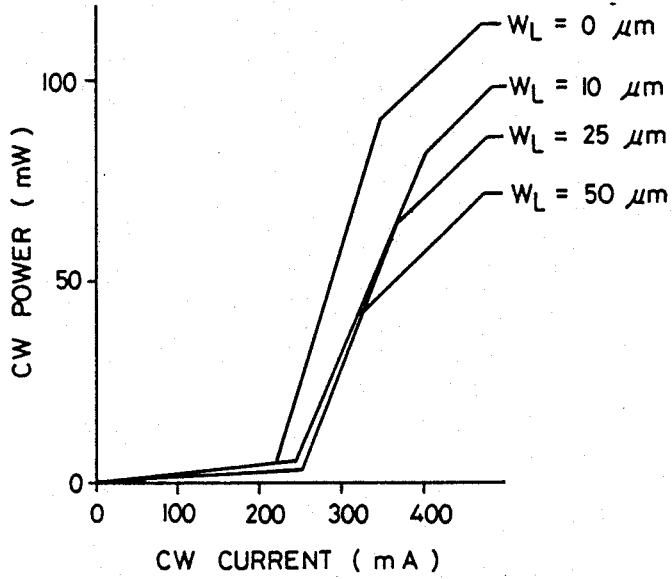
FIG._6.
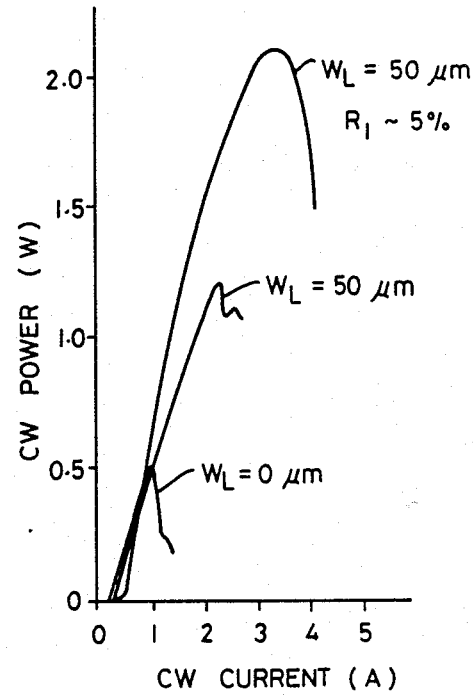
FIG._7.

WINDOW LASER WITH HIGH POWER REDUCED DIVERGENCE OUTPUT

TECHNICAL FIELD

The present invention relates to semiconductor lasers and in particular to window lasers, i.e. lasers fabricated with regions having reduced absorption and located adjacent to the mirror facets.

BACKGROUND ART

Semiconductor laser arrays have recently attained optical power outputs which make them attractive for many high power applications, such as for pumping solid state lasers. For example, AlGaAs buried heterostructure lasers produced with silicon impurity induced disordering (IID) have achieved low threshold, high efficiencies, and power levels of up to 0.5 W cw. One limitation, however, on output power capability for AlGaAs lasers is catastrophic damage to the laser facets or mirrors, due in part to local heating at high output powers from optical absorption in the active region near the facets. Additionally, at somewhat lower power levels, facet erosion caused by oxidation of the active region may occur thereby reducing the useful life of the laser. It is known that improved catastrophic damage levels can be obtained either by shifting the laser emission to a longer wavelength, i.e. lower energy, relative to the threshold absorption energy at the facet or by increasing the bandgap of the facet material, i.e. the absorption energy at the facet, relative to the laser emission energy. In either instance, regions adjacent to the facets characterized by substantially lower optical absorption are created. These regions are called "windows" and lasers having these facet windows are called "window lasers".

Window lasers have been fabricated by a variety of methods. One method is to introduce a change of material composition by the selective diffusion of zinc into the laser cavity everywhere except at the facets while maintaining a constant thickness waveguide layer. The diffused zinc shifts the laser emission to a longer wavelength. The power output of zinc diffused window lasers is limited by catastrophic damage due to local heating in the bulk rather than at the facets.

More recently various methods have been used to increase the effective bandgap at the facet, including zinc impurity induced disordering and etching and regrowth. Blauvelt et al. in Applied Physics Letters, vol. 40, no. 12, June 15, 1982, pp. 1029-1031, describe a buried heterostructure window laser produced by the latter method. Portions of the active layer which will eventually form the window regions are removed by selective etching, then a thicker transparent waveguide or window of wider bandgap material is regrown in its place.

Another method for increasing the available power level limited by catastrophic facet damage is to grow very thin active layers to lower the optical power density at the facets. In order to avoid increasing the threshold current because of a decrease of gain, nonuniformity of the active layer for liquid phase epitaxy grown layers, and the influence of the active layer interfaces, the active layer is tapered, i.e. made thinner only near the facets. Burnham et al. in U.S. Pat. No. 4,546,480 and Murumaki et al. in Electronics Letters, vol. 22, no. 4, Feb. 13, 1986, pp. 217-218, disclose two distinct lasers produced by this technique.

It is desirable, when producing window regions in lasers, not to significantly increase scattering, propagation and diffraction losses. In order to reduce diffraction loss in the vertical direction perpendicular to the plane of the active region, it is preferred that a waveguide remain in the window regions to confine the light. Unfortunately, some window formation techniques, such as impurity induced disordering, may completely destroy the vertical waveguides in the window region. Other window formation techniques, such as etching and regrowth, can introduce abrupt boundaries that cause large scattering losses. Thinning the active region can cause propagation losses which depend on the degree of thinning and the length of the window regions.

An object of the present invention is to produce a semiconductor window laser with high power output having reduced far field divergence, and without substantially increased losses in the laser cavity.

DISCLOSURE OF THE INVENTION

The above object has been met with a semiconductor laser including at least one window region having a transparent waveguide layer characterized by a broader guided mode for lightwaves than the active region to which the waveguide layer is optically coupled. The presence of the transparent waveguide layer in the window region reduces the diffraction losses in the window region, while the broadened guided mode for lightwaves reduces the optical power density at the mirror facets thereby enabling a high power output to be achieved without catastrophic failure. The broadened mode that is supported by the transparent waveguide layer also results in a reduced far field divergence in the transverse direction normal to the plane of the active region, i.e. a transverse divergence which is substantially less than the divergence from lasers without a broadened mode.

Both the active region and the transparent waveguide layer are bounded by semiconductor cladding layers characterized by indices of refraction which are less than the indices of refraction of the active region and the transparent waveguide layer, i.e. both act as waveguides. However, the transparent waveguide layer has an effective bandgap which is greater than that of the active region, so that the waveguide layer is transparent to lightwaves generated in the active region. Further, as already noted, the transverse waveguiding of the transparent waveguide layer is weaker than the transverse waveguiding of the active region to which it is optically coupled, so that the guided transverse mode is broadened for layers of similar lateral extent. This may be accomplished by giving the transparent waveguiding layer a thickness which is greater than the thickness of the corresponding portion of active region or by making the refractive index difference between the cladding layers and active region greater than the refractive index difference between the cladding layers and the transparent waveguide layer, or both. Typically, two window regions are adjacent to the pair of end facets, and the active region is centered between the two window regions, although other configurations may be made.

To reduce scattering losses, the transparent waveguide layer is preferably optically coupled to the active region via a transition region characterized by a gradual change rather than an abrupt step, in the guided mode width of the lightwaves, as for example from a tapered thickness of the transparent waveguide layer. Window regions having transparent waveguide layers can be produced by impurity induced disordering, i.e. the diffusion of silicon, zinc, tin or other impurity through the semiconductor layers to form the window region. As a result, the interfaces between the transparent waveguide layer and adjacent layers is disordered or smeared, while the active region not diffused with impurities remains ordered. Alternatively, other methods of making the transparent waveguide layer may be used.

The resulting laser produces an output light beam with a transverse far field divergence of less than 25 degrees and with a continuous wave power of at least two watts without catastrophic facet damage. Up to 22 watts peak power output in the pulsed mode has been attained.

BRIEF DESCRIPTION OF THE DRAWINGS

FIG. 1 is a perspective view of a semiconductor window laser of the present invention.

FIGS. 2-4 are side sectional views taken along the line A—A in FIG. 1 and illustrating a method for making the laser in FIG. 1.

FIG. 4A is a plot of index of refraction versus transverse position for the semiconductor layers in the laser of FIG. 4.

FIG. 5 is a sectional view taken along line B—B in FIG. 1.

FIGS. 6-7 are graphs of CW power vs. current, comparing optical output for the laser in FIG. 1 with various window lengths $W_L$ to a nonwindow laser of similar construction ($W_L = 0$ μm).

BEST MODE FOR CARRYING OUT THE INVENTION

With reference to FIG. 1, a semiconductor window laser comprises a plurality of contiguous semiconductor layers including a substrate 11, a lower cladding layer 13, one or more layers 15 which together form an active region 43 and transparent waveguides 47 and 45, a first upper cladding layer 17, a zinc-diffused second upper cladding layer 19 and a cap layer 21. The laser is thus a monolithic structure of semiconductor layers 13, 15, 17, 19 and 21 formed over a single substrate 11. A pair of end facets 24 and 26 on opposed ends of the laser form partially reflective mirror surfaces defining a resonant optical cavity in the semiconductor body therebetween. The resonant optical cavity may be defined by distributed feedback of lightwaves. The laser is preferably fabricated on a wafer substrate by metal-organic chemical vapor deposition, but may also be fabricated by liquid phase epitaxy, molecular beam epitaxy or other known crystal growth processes.

For purposes of discussion, three mutually perpendicular directions, indicated by arrows X, Y and Z, are defined. A "lateral" direction is indicated by arrow X. A "transverse" direction, perpendicular to the plane of the active region 43 and extending through the various semiconductor layers, is indicated by arrow Y. A "longitudinal" direction, extending from facet 24 to facet 26 and vice versa, is indicated by arrow Z.

The laser has at least one window region 23 having a transparent waveguide layer 15. In FIG. 1, two window regions 23 with transparent waveguides 45 and 47 are seen, the window regions being adjacent to the pair of end facets 24 and 26 with active region 43 being centered between the two window regions 23. Lasers with other numbers and positions of window regions 23 may also be fabricated. The window regions 23 in FIG. 1 are preferably formed by impurity induced disordering, the dashed lines 37 and 39 demarcating the approximate extent of impurity diffusion. However, other fabrication methods, such as etching and regrowth, may also be used to produce the structure of the present invention.

The laser also includes conductive contact stripes 27 on a top surface 25 and a conductive layer 28 on substrate 11 for forward biasing the laser to inject current into active region 43. Injecting current into the active region causes lightwaves to be generated which then propagate in the resonant optical cavity under lasing conditions. Transparent waveguide layers 45 and 47 are optically coupled to the active region 43. The transparent waveguide layers 45 and 47 are weaker transverse waveguides than the active region 43, and so they are characterized by a broader guided transverse mode than the active region. As a result, a light output beam 29 is produced with a broader transverse near field profile and a substantially lower transverse far field divergence than lasers with the active region 43 extending to the mirror facet 24 and 26. Output beams 29 may be emitted from either one or both of the facets 24 and 26.

In addition to transverse waveguiding, the laser may also include structures which provide lateral waveguiding. For example, in FIG. 1, contact stripes 27 provide a mechanism for gain guiding. Other waveguide structures can include buried heterostructure waveguides, channeled-substrate-planar waveguides, impurity induced disordering waveguides, mesa substrate index guides, ridge waveguides, rib waveguides, and other structures known in the art. The laser may also be a broad area laser. In such cases, the transparent waveguide layer supports a broader transverse mode than said active region of similar lateral extent, i.e. a transparent waveguide portion at one lateral position supports a broader transverse mode than the corresponding active region portion to which the transparent waveguide portion optically couples.

FIGS. 2-5 show one method of fabricating the laser of FIG. 1. With reference to FIG. 2, semiconductor layers 13, 15, 17, 19 and 21 are first grown on substrate 11 using one of the known crystal growth processes mentioned above. Lateral waveguide structures may be formed at this step using known techniques. Substrate 11 is typically composed of n-GaAs. Lower cladding layer 13 is typically composed of n-Ga$_{1-x}$Al$_x$As, where x is usually about 0.4, with a doping level in a range from $10^{17}$ to $10^{18}$ cm$^{-3}$ (Se) and a thickness generally about 1.0 μm. Upper cladding layer 17 is typically composed of p-Ga$_{1-y}$Al$_y$As, where y is about 0.3, and the doping level is in a range from $10^{17}$ to $10^{18}$ cm$^{-3}$ (Mg) The thickness of upper cladding layer 17 may vary depending on the type of lateral waveguide structure to be formed, if any, but typically ranges from 1.0 μm to 1.5 μm. Cap layer 21 is typically composed of p-GaAs with a thickness of about 0.5 μm. Composition variations are permissible.

Layer or layers 15 may or may not be intentionally doped and might consist of four 50 to 150 Å thick quantum wells of GaAs alternating with three 30 to 150 Å thick barriers of Ga$_{0.8}$Al$_{0.2}$As. Such quantum-well structures are known and described in an article by N. Holonyak, Jr. et al. entitled "Quantum-well Heterostructure Lasers" in IEEE Journal of Quantum Electronics, vol. QE-16, no. 2 (February, 1980), pp. 170–186. Alternatively, instead of a plurality of thin layers in a quantum-well or multiple-quantum-well heterostructure, layer 15 may be formed of $Ga_{1-w}Al_wAs$, where w is typically less than 0.1. In any case, layer or layers 15 with the highest effective index of refraction and lowest effective band gap, forms a transverse waveguide which after completion of the laser fabrication will comprise, as seen in FIG. 1, an active region 43 for lightwave generation and propagation under lasing conditions and at least are transparent waveguide 45 and 47 optically coupled to the active region. By "effective" index of refraction and bandgap of an active region comprising thin quantum-well and barrier layers, each with their own absolute indices of refraction and bandgaps, we mean the measured index of refraction and bandgap values for a corresponding single semiconductor active layer that produces an output most similar to the actual active region. The index of refraction is greatest for active region 43 and transparent waveguides 45 and 47, and lowest for cladding layers 13 and 17.

It will, of course, be recognized that the conductivity type of the layers may be reversed from those noted above. Likewise, instead of GaAs and GaAlAs, other light emitting semiconductor materials, such as GaAlSb, InP, InGaAsP, other Group III-V compounds, Group II-VI compounds and Group IV-VI compounds may be used. Moreover, the dimensions, doping levels, compositions and dopants mentioned above are exemplary only.

After the growth of the semiconductor layers, the wafer is removed from the growth chamber, and a disorder inducing impurity, such as silicon, zinc or tin, is diffused into the semiconductor layers. For example, cap layer 21 may be covered with a protective layer 31 of $Si_3N_4$. Protective layer 31 is then selectively removed from over areas where window regions are to be formed, resist followed by etching in a standard etchant solution. Next, silicon may be driven into the semiconductor layers from the surface or implanted. Diffusion may be produced by annealing the wafer at elevated temperatures for a predetermined period of time. By varying the implantation dose, the annealing temperature, the type of impurity, and the diffusion time, the depth of impurity diffusion, and consequently the disordering depth can be varied to produce a desired amount of disordering or smearing of the active region/cladding interfaces 32 and 34. The actual diffusion time will vary depending on how deep below the surface the active region layers 15 lie. Previously, diffusion times as long as 10 to 20 hours were used to ensure good window region transparency. However, as the diffusion time lengthens the degree of disordering increases, and any remaining waveguide becomes so weak as to first support multimode propagation and eventually lead to large diffraction losses. In the present invention, impurity induced disordering occurs to a point just sufficient to produce a transparent single mode waveguide.

For example, in a wafer with a 1 $\mu$m deep waveguide layer 15, silicon may be implanted into cap layer 21 and even a portion of upper cladding layer 17 at 80 keV to a dose of about $10^{16}$ cm$^{-3}$. The extent of the implants is indicated in FIG. 2 by dashed lines 33 and 35. Next, the wafer is annealed at 850° C. for a diffusion time in a range from about 2½ to 4 hours. Diffusion times longer than about 6 hours produce waveguides which are too weak to support single transverse mode propagation.

In another example, silicon may be deposited as a layer on the wafer surface and then driven at a temperature of about 850° C. from the surface into the semiconductor layers below to an electrical concentration level of about $3 \times 10^{18}$ cm$^{-3}$. Diffusion times are preferably in a range from about 8 to 9 hours. Diffusion times greater than about 10 hours will produce waveguides which are too weak to support single transverse mode propagation. Each impurity has its own diffusion rate. Zinc, for example, has much shorter diffusion times and may be driven from the wafer surface at about 600° C. for 1½ to 2½ hours.

In FIG. 3, impurity diffusion is indicated by arrows 41. The impurity diffuses through layer 15, the approximate extent of diffusion being indicated by dashed lines 37 and 39, thereby forming window regions 23 with transparent waveguide layers formed from layer 15. Several changes to layer 15 occur to create transparent waveguide layers 45 and 47, seen in FIG. 4. These changes include an increase in thickness in waveguide layer 15 so that transparent waveguides 45 and 47 are thicker than active region 43. Another change that occurs is a decrease in the refractive index difference between waveguide layer 15 and cladding layers 13 and 17 so that the refractive index difference between active region 43 and cladding layers 13 and 17 bounding active region 43 is greater than the refractive index difference between transparent waveguides 45 and 47 and cladding layers 13 and 17 bounding the transparent waveguides.

In FIG. 4A, these thickness and index of refraction changes are indicated on graphs of index of refraction n versus transverse position Y. In the left hand plot, active region 43 may be a multiple quantum-well structure with alternating layers of GaAs and $Ga_{0.8}Al_{0.2}As$ with an index of refraction which is highest, typically about 3.55, for the thin GaAs layers, and slightly lower for the thin $Ga_{0.8}Al_{0.2}As$ layers. Cladding layers 13 and 17 with typical compositions of $Ga_{0.6}Al_{0.4}As$ and $Ga_{0.7}Al_{0.3}As$ respectively have lower indices of refraction than the active region 43 which they bound. The thickness $T_1$ of active region 43 is typically in a range from 0.03 $\mu$m to 0.1 $\mu$m. The active region-to-cladding refractive index difference $\Delta N_1$, is typically about 0.005.

Impurity induced disordering causes aluminum atoms in the cladding layers to diffuse across the interfaces into the waveguide layer, smearing or disordering the interface. This produces an increase in the effective bandgap of layer 15 thereby making the waveguide 47 transparent to lightwaves generated in active region 43. Impurity diffusion also causes a decrease in the refractive index difference so that, as seen in FIG., 4A, the refractive index difference $\Delta N_2$ between transparent wavegide layer 47 and cladding layers 13 and 17 bounding transparent waveguide layer 47 is less than the refractive index difference $\Delta N_1$. Transparent waveguide layer 47 may also be characterized by a graded transverse refractive index profile, as shown in the right hand plot, with a maximum index of refraction being located near the center of transparent waveguide layer 47. Thickness $T_2$ of transparent waveguide layer 47 is also seen to be greater than thickness $T_1$ of active region 43.

Referring again to FIG. 4, transparent waveguide layers 45 and 47 are typically optically coupled to the active region 43 via transition regions 46 and 48 characterized by a gradual change in the guided transverse mode width of the lightwaves. The thickness and typically the effective bandgap of the transparent waveguide layers 45 and 47 may be tapered, i.e. may gradually increase, from values in the active region 43 to higher values in window regions 23. The change in refractive index difference noted above may also be gradual through a transition region. Alternatively, one or more of these parameters may be abruptly stepped.

After formation of window regions 23, zinc is diffused into cap layer 21 and typically also into the top portion of cladding layer 17 to form second upper cladding layer 19. Zinc diffusion, indicated in FIG. 4 by arrows labeled Zn, provides a low resistance contact surface for current injection. Next, with reference to FIG. 5, the surface of cap layer 21 is selectively implanted with protons H+ to confine the current to stripe regions 49 between implants 51. The wafer is metallized to produce ohmic contacts 27 and 28 to the cap layer 21 and substrate 11 respectively. Contact layer 28 is typically composed of Au/Ge alloy. Contacts 27 are typically composed of Ti/Pt/Au alloy. The bars are cleaved into individual laser die with end facets 24 and in FIG. 1 being defined by the cleavages, and mounted onto copper heatsinks with indium solder, the cap layer 21 side being bonded to the heatsink. The mirrors 24 and 26 may be coated with a dielectric material, such as $Al_2O_3$, to produce a high reflectivity rear facet 26, typically having a reflectivity of about 95%, and to produce a low reflectivity front facet 24, typically having a reflectivity of about 5%. Such a coating has a thickness of approximately one-quarter wavelength of the lightwaves in the dielectric material, i.e. a thickness of about $\lambda/4n$, where $\lambda$ is the wavelength of the lightwaves in a vacuum and n is the index of refraction of the dielectric material. Alternatively, facets 24 and 26 remain uncoated.

With reference to FIG. 6, the light output power versus current characteristic for typical devices of varying window region lengths is shown. The typical laser used for the measurements is a 10 stripe array with a 100 μm wide aperture. For a nonwindow laser of like construction (window length $W_L=0$) the threshold current is typically about 225 mA and the slope efficiency is about 0.72 mW/mA. Introduction of a window region results in a laser ($w_L$32 10 μm) with a threshold current of about 265 mA, i.e. about 17% higher than the threshold current of a nonwindow laser. The slope efficiency also decreases by about 25% to about 0.54 mW/mA. However, the decreases in performance are not dependent on the length of the window region as lasers with $W_L=25$ μm and $W_L=50$ μm have approximately the same threshold current and slope efficiency as lasers with window length $W_L=10$ μm. This indicates that propagation losses and diffraction losses are not significant, since both are distributed losses which would be dependent on the window region length, and that the transparent waveguide layer provides a low loss mechanism for lightwave propagation. It is believed that the measured losses are due nearly entirely to scattering losses at an abrupt waveguide discontinuity from the different transverse mode widths supported by window and active regions. This loss is reduced for lasers using tapered transition regions coupling the window regions to the active regions.

With reference to FIG. 7, the optical power output vs. current is shown for lasers driven to their catastrophic damage levels. For a nonwindow laser ($W_L=0$ μm), the catastrophic damage level is typically about 530 mW cw at a current level of about 1 A. For a window laser with a window length $W_L$ equal to about 50 μm, the catastrophic damage level is about 1.2 W cw at a current level of about 2.5 A. Further, by applying a quarterwave antireflection coating to the front mirror facet of the window laser, so that the front facet reflectivity $R_1$ is lowered to about 5%, a maximum power output of about 2.4 W cw is obtained. The rollover in the light output power versus current characteristic is due to thermal heating in the device, and this curve retraces itself when the current is decreased. In order to determine the catastrophic power limit, the diode laser may be operated in a pulsed mode. Using a 100 μs pulse, a 3.5 W catastrophic power limit is observed. The catastrophic power limit is approximately constant for pulse widths greater than about 1 μs, i.e. for quasi-continuous wave operation. For times less than 1 μs, the peak temperature at the facets decreases with decreasing pulse width, resulting in a catastrophic power limit which is inversely proportional to the square root of the pulse width. For the 50 μm long window, coated facet laser noted above power limits of 5 W, 8 W and 22 W have been observed for pulse widths of 500 ns, 200 ns and 50 ns pulses respectively. The latter case however is apparently not limited by catastrophic degradation but by parasitic leakage paths at high current levels that reduced the differential efficiency of the laser. Accordingly, it is readily apparent that window lasers retaining a transparent waveguide layer in the window regions that supports a waveguide transverse mode width greater than the active region have greatly increased catastrophic damage levels.

Another characteristic of window lasers with transparent waveguide layers is a reduction in the transverse far field divergence of the laser output beam. Nonwindow lasers have a transverse divergence, measured at full width half maximum, of at least 26° and typically about 34°, depending on the active region thickness, the refractive index difference between the active region and cladding layers, and other waveguiding parameters. Window lasers produced in accord with the present invention have transverse divergences of less than 25° and typically about 20°.

The window laser in accord with the present invention, i.e. having a transparent waveguide layer supporting a wider or broader guided transverse mode than the active region and coupled to the active region via a transition region has been seen to have a high power output and reduced far field divergence without substantially increased scattering propagation and diffraction losses in the laser cavity. While the method of making such a laser has been described with respect to impurity induced disordering, it will be apparent to a skilled artisan that other methods of making the laser structure, such as etching and regrowth, can also be used.

We claim:
1. A semiconductor laser comprising,
a plurality of contiguous semiconductor layers forming a semiconductor body, a portion of at least one of said layers forming an active region for lightwave generation and propagation under lasing conditions in a resonant optical cavity providing optical feedback of said lightwaves, said active region characterized by ordered semiconductor layer interfaces,
biasing means for injecting current into said active region to generate said lightwaves, and at least one window region in said semiconductor body transparent to said light waves and having a transparent waveguide layer optically coupled to said active region, said active region being outside of said at least one window region, said transparent waveguide layer being formed from a remaining portion of the same said layers which form said active region, said transparent waveguide layer characterized by disordered interfaces, wherein said transparent waveguide layer is characterized by a single broader-guided transverse mode for said lightwaves than said active region of similar lateral extend so as to produce an output beam with a reduced transverse far field divergence.

2. The laser of claim 1 wherein said transparent waveguide layer has a thickness which is greater than the thickness of said active region.

3. The laser of claim 1 wherein said active region and said transparent waveguide layer are each bounded by semiconductor cladding layers characterized by indices of refraction which are less than the indices of refraction of said active region and of said transparent waveguide layer, the index of refraction difference between said active region and the cladding layers bounding said active region being greater than the index of refraction difference between said transparent waveguide layer and said cladding layers bounding said transparent waveguide layer.

4. The laser of claim 1 wherein said transparent waveguide layer is characterized by a graded transverse refractive index profile with a maximum index of refraction being located near the center of the transparent waveguide layer.

5. The laser of claim 1 wherein said transparent waveguide layer is optically coupled to said active region via a transition region characterized by a gradual change in the guided mode width of said lightwaves.

6. The laser of claim 5 wherein said the thickness of said transparent waveguide layer gradually increases in said translation region in a direction away from said active region.

7. The laser of claim 5 wherein said waveguide layer is characterized by thickness and bandgap values both of which being tapered in said transition region from first thickness and bandgap values in said active region to higher thickness and bandgap values in said window region.

8. The laser of claim 1 wherein said at least one window region with said transparent waveguide layer is characterized by a disorder inducing impurity diffused through said semiconductor layers.

9. The laser of claim 8 wherein a disorder inducing impurity diffused through window region is selected from the group consisting of silicon, zinc, and tin.

10. The laser of claim 1 wherein two window regions, each having a transparent waveguide layer, are adjacent to said pair of end facets, and said active region is centered between said two window regions.

11. The laser of claim 1 wherein said output beam is characterized by a continuous wave power of at least 2 Watts without causing catastrophic degradation of the pair of end facets.

12. The laser of claim 1 wherein said resonant optical cavity is defined between a pair of end facets, at least one of said end facets being coated with a dielectric material to a thickness of approximately one-quarter wavelength of said lightwaves in said dielectric material.

13. A semiconductor laser comprising,
a plurality of contiguous semiconductor layers forming a semiconducor body, a portion of at least one of said layers forming an active region for lightwave generation and propagation under lasing conditions in a resonant optical cavity providing feedback for said lightwaves, said active region characterized by ordered semiconductor layer interfaces,
biasing means for injecting current into said active region to generate said lightwaves, and
at least one transparent waveguide layer in said semiconductor body and formed from a remaining portion of the same said layers which form said active region, said transparent waveguide layer characterized by disordered semiconductor layer interfaces, said transparent waveguide layer optically coupled to said active region via a transition region characterized by a gradual increase in the thickness and bandgap of said waveguide layer from first thickness and bandgap values in said active region to higher thickness and bandgap values in said transparent waveguide layer.

14. The laser of claim 13 wherein both said active region and said transparent waveguide layer are bounded by semiconductor cladding layers with indices of refraction less than those of said active region and transparent waveguide layer, wherein the refractive index difference between the cladding layers and said active region is greater than the refractive index between the cladding layers and said transparent waveguide layer, the refractive index difference gradually decreasing in said transition region in a direction away from said active region.

15. The laser of claim 13 wherein said transparent waveguide layer is characterized by a graded transverse refractive index profile with a maximum index of refraction located near the center of the waveguide layer.

16. The laser of claim 13 wherein said transparent waveguide layer is characterized by an impurity diffused through said semi-conductor layers.

17. The laser of claim 13 wherein two transparent waveguide layers are adjacent to a pair of end facets of said laser and said active region is located between said two waveguide layers.

18. The laser of claim 13 wherein said resonant optical cavity is defined between end facets for producing said feedback, at least one of said facets being coated with a dielectric material to a thickness of approximately one-quarter wavelength of a said lightwaves in said dielectric material.

19. A semiconductor laser comprising,
a plurality of contiguous semiconductor layers forming a semiconductor body, a portion of at least one of said layers forming an active region for lightwave generation and propagation under lasing conditions in a resonant optical cavity, said optical cavity characterized by a first index of refraction for said lightwaves, said active region characterized by ordered semiconductor layer interfaces, said
biasing means for injecting current into active region to generate said lightwaves,
means for obtaining optical feedback of said lightwaves in said resonant optical cavity sufficient for lasing operations, and
at least one window region in said semiconductor body transparent to said lightwaves and having a transparent waveguide layer optically coupled to said active region, said active region being outside of said at least one window region, said transparent waveguide layer being formed from a remaining portion of the same said layers which form said active region, said transparent waveguide layer characterized by disordered semiconductor layer interfaces and by a second index of refraction for said lightwaves, wherein said semiconductor layers including cladding layers bounding said active region and said transparent waveguide layer, said cladding layers characterized by indices of refraction that are less than said first and second indices of refraction, a first index of refraction difference between said transparent waveguide and said cladding layers being less than a second index of refraction difference between said active region and said cladding layers.

20. The laser of claim 19 wherein said transparent waveguide layer is characterized by a graded transverse refractive index profile with a maximum index of refraction being located near the center of the transparent waveguide layer.

21. The laser of claim 19 wherein said transparent waveguide layer is optically coupled to said active region via a transistion region characterized by a gradual change in the index of refraction difference between said transparent waveguide layer and said cladding layers.

22. The laser of claim 19 wherein said window regions are characterized by an impurity diffused through said semiconductor layers.

23. The laser of claim 19 wherein two transparent waveguide layers are adjacent to cavity defining end facets and said active region is centered between said two waveguide layers.

24. The laser of claim 19 wherein said optical feedback means comprising a pair of end facets defining said resonant optical cavity, at least one end facet being coated with a dielectric material to a thickness of approximately one-quarter wavelength of said lightwaves in said dielectric material.

* * * * *

UNITED STATES PATENT AND TRADEMARK OFFICE
CERTIFICATE OF CORRECTION

PATENT NO. : 4,845,725

DATED : July 4, 1989

INVENTOR(S) : David Welch, et al.

It is certified that error appears in the above-identified patent and that said Letters Patent is hereby corrected as shown below:

Title Page  Column 1 [75] Inventors: "David F. Welch; Donald R. Scifres, both of San Jose, Calif." should read - - David F. Welch; Donald R. Scifres, both of San Jose, Calif.; Robert L. Thornton, East Palo Alto, Calif.; Robert D. Burnham, Wheaton, Illinois - -.

Column 5, line 39, "formed, resist" should read - - formed, such as by lithographic pattern development of a photoresist - -.

Column 6, line 54, "wavegide" should read - - waveguide- -.

Column 7, line 21, "end facets 24 and" should read - - end facets 24 and 26 - -.

Column 7, line 44, "($w_L$ 32 10µm) should read - - ($W_L$ = 10µm) - -.

Claim 1, column 9, line 13, "extend" should read - - extent - -.

Claim 19, column 10, line 61, delete the word "said".

Claim 24, column 12, line 17, "comprising" should read - - comprise - -.

Signed and Sealed this

Eighth Day of May, 1990

Attest:

HARRY F. MANBECK, JR.

*Attesting Officer*  *Commissioner of Patents and Trademarks*